US008138838B2

(12) United States Patent
Hogan

(10) Patent No.: US 8,138,838 B2

(45) Date of Patent: Mar. 20, 2012

(54) ELECTRON BEAM SWITCH

(75) Inventor: Thomas C. Hogan, Lutz, FL (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 742 days.

(21) Appl. No.: 12/184,693

(22) Filed: Aug. 1, 2008

(65) Prior Publication Data

US 2010/0012865 A1 Jan. 21, 2010

Related U.S. Application Data

(60) Provisional application No. 61/082,103, filed on Jul. 18, 2008.

(51) Int. Cl.
*H03F 3/08* (2006.01)

(52) U.S. Cl. .......................................... 330/308; 330/4.7

(58) Field of Classification Search .................. 315/366, 315/364; 330/308, 4.7
See application file for complete search history.

(56) References Cited

U.S. PATENT DOCUMENTS

| | | | | |
|---|---|---|---|---|
| 4,663,559 | A | 5/1987 | Christensen | |
| 5,068,580 | A * | 11/1991 | Smith et al. | 315/366 |
| 6,800,877 | B2 * | 10/2004 | Victor et al. | 257/110 |
| 6,801,002 | B2 * | 10/2004 | Victor et al. | 315/169.3 |
| 7,064,500 | B2 * | 6/2006 | Victor et al. | 315/321 |
| 2004/0080285 | A1 * | 4/2004 | Victor et al. | 315/365 |

OTHER PUBLICATIONS

"Traveling-wave-tube." Wikipedia, The Free Encyclopedia. Jul. 21, 2008, 13:17 UTC.21 Jul. 2008 ,http://en.wikipedia.org/w/index.php?title=Traveling-wave_tube&printable=yes.

* cited by examiner

*Primary Examiner* — Nikita Wells
*Assistant Examiner* — Johnnie Smith

(57) ABSTRACT

The present invention is directed to an electron beam crossbar switch for interconnection between communication units. The crossbar switch includes an array of electrically charged particle emitter source devices with an input connected to a slow wave structure coupled to the emitter source. An array of detectors is positioned relative to the array of emitter devices for receiving charged particles from various of the emitter devices. X and y deflection means are positioned adjacent each of the emitters for directing the charged particles from each of the emitters to at least one of the detectors to provide more signal output and a reduction in deflection accuracy.

13 Claims, 4 Drawing Sheets

ELECTRON BEAM SWITCH

CROSS REFERENCE TO RELATED APPLICATIONS

This application claims the benefit of U.S. Provisional Patent Application Ser. No. 61/082,103, filed on 18 Jul. 2008, entitled "Electron Beam Switch".

BACKGROUND

The conveyance of information or data in electronic form generally falls into four unique categories: (1) photonic, where the information is conveyed by a modulated stream of photons, transported by a solid physical medium, as exemplified by fiber optic communication systems; (2) photonic, where the information is conveyed by a modulated stream of photons, transported through free space or air as exemplified by radio communication systems; (3) electronic, where the information is conveyed by a modulated stream of electrons in a solid physical media, such as a wire or silicon chip; and (4) electronic, where the information is conveyed by a modulated stream of electrons traveling through free space.

Fundamental to any computer or communications system is the conveyance of information between particular sources and destinations. Devices generally known as switches direct the data flow between particular input and output ports. Well-known techniques can be used to design switches adapted to the four classes of data conveyance mentioned above.

One technique for photonic data switching involves the use of a laser whose frequency or color can be adjusted. This adjustability combined with a prism-like device that translates color change into spatial direction change allows a laser beam to be redirected in lockstep with the frequency of the laser. By changing direction, a beam can be steered to a particular output port amongst an array of ports spatially offset from one another. Although this technique holds the promise of high-speed switching, it has not yet been adapted to scan a large number of output ports.

Another method of switching photonic data is known as microelectromechanical system (MEMS)-based movable mirror switches. Movable mirrors direct data-modulated laser beams to particular output ports. Even the tiniest of MEMS mirrors has tangible mass and needs to physically move to redirect the beam. These two facts limit the switching speed of any MEMS technique to the point that the technology is best suited as a reconfigurable patch panel rather than a packet by packet data switch.

Another technique for packet switching at radio frequencies involves the use of phased antenna arrays to steer the direction of the radio signal. At millimeter wavelengths, these phased array antennas can be acceptably small, but supporting a large number of ports using such antennas requires a complex phased antenna array.

Another method of electronic switching uses single-stage crossbars. A crossbar is a semiconductor-based logic device that is used for switching. The main disadvantage of single-stage crossbars is scalability: the number of internal components in a crossbar increases exponentially or nearly exponentially as the number of ports increases.

Crossbars are also limited by crosstalk. As the number of crossbar switches increases, the unwanted coupling from individual switches in the off state increases. Crosstalk limits the maximum size of a crossbar switch, since the increased crosstalk noise reduces the signal-to-noise ratio of the desired signal.

The Batcher Banyan tree architecture is an interconnection topology that allows smaller crossbars to be combined hierarchically to form a larger, higher port count switch. The Batcher Banyan tree architecture reduces the number of switching elements relative to a flat hierarchy, but increases the number of stages in the hierarchy and thereby increases the latency compared to a flat hierarchy.

As described above, these and other various prior art switching techniques have a variety of disadvantages. What is needed, therefore, are improved switching techniques which overcome the disadvantages of the prior art.

SUMMARY

The present invention is directed to an electron beam crossbar switch for interconnection between communication units. The crossbar switch includes an array of electrically charged particle emitter source devices with an input connected to a slow wave structure coupled to the emitter source. An array of detectors is positioned relative to the array of emitter devices for receiving charged particles from various of the emitter devices. X and y deflection means are positioned adjacent to each of the emitters for directing the charged particles from each of the emitters to at least one of the detectors.

Certain embodiments of the present invention include a shadow mask, positioned adjacent the front of the array of detectors, for capturing stray particles and reducing background noise. The shadow mask may also provide a location to project the electron beam not associated with any detector so that the beam does not need to be turned off when the particular input port is idle or in the process of selecting a different detector.

Embodiments of the present invention also include an electron beam crossbar switch for interconnection between processors, memory units or communications nodes; an array of electron emitter source devices, each source device projecting an electron beam through a slow wave structure constructed by a conductive helix having a data input connected to each of the helices; and an array of detectors positioned relative to the array of electron emitter devices with coupled slow wave structures for receiving electrons from various of the emitter devices with slow wave structures, each of the detectors having its own slow wave structure through which the electron beam is projected and which function to extract the data from the electron beam. X and y electrostatic deflection plates are positioned adjacent to each of the electron emitters with adjacent slow wave structures for directing the electrons from each of the emitters with adjacent slow wave structure to a selected one or more of the detectors with adjacent slow wave structure.

For example, one embodiment of the present invention is directed to an electron beam crossbar switch for interconnection between communication units. The crossbar switch comprises: an array of electron emitters associated with a first plurality of slow wave structures; a plurality of data inputs connected to the first plurality of slow wave structures, wherein each of the data inputs is connected to a corresponding one of the first plurality of slow wave structures; an array of data output detectors positioned relative to the array of electron emitter slow wave devices for receiving electrons from any of the first plurality of slow wave structures; first deflection means positioned between one of the first plurality of slow wave structures and the detectors for directing the electrons from one of the emitters to a selected one of any of the data output detectors; and a plurality of data outputs connected to the array of data output detectors, wherein each of the data outputs is connected to a corresponding one of the array of data output detectors.

Another embodiment of the present invention is directed to a method for interconnecting communication units comprising: (A) emitting electrons from an array of electron emitters; (B) reducing the forward propagation of an electromagnetic wave associated with the electrons; and (C) directing the electrons from one of the emitters to a selected one of any of an array of data output detectors.

Advantages of the present invention ensue from its implementation of a high bandwidth crossbar switch that consumes less power and provides higher communication capacity than previous implementations. In particular, by employing a slow wave structure to modulate the electron beam, bandwidths on the order of 10-100 times greater than those achieved with simple control grid modulation are possible. And, by employing low voltage electron collectors rather than returning the electrons to the high voltage accelerating electrode, power reductions on the order of a factor of 10 are possible.

Other features and advantages of various aspects and embodiments of the present invention will become apparent from the following description and from the claims.

DETAILED DESCRIPTION

Figure 1:
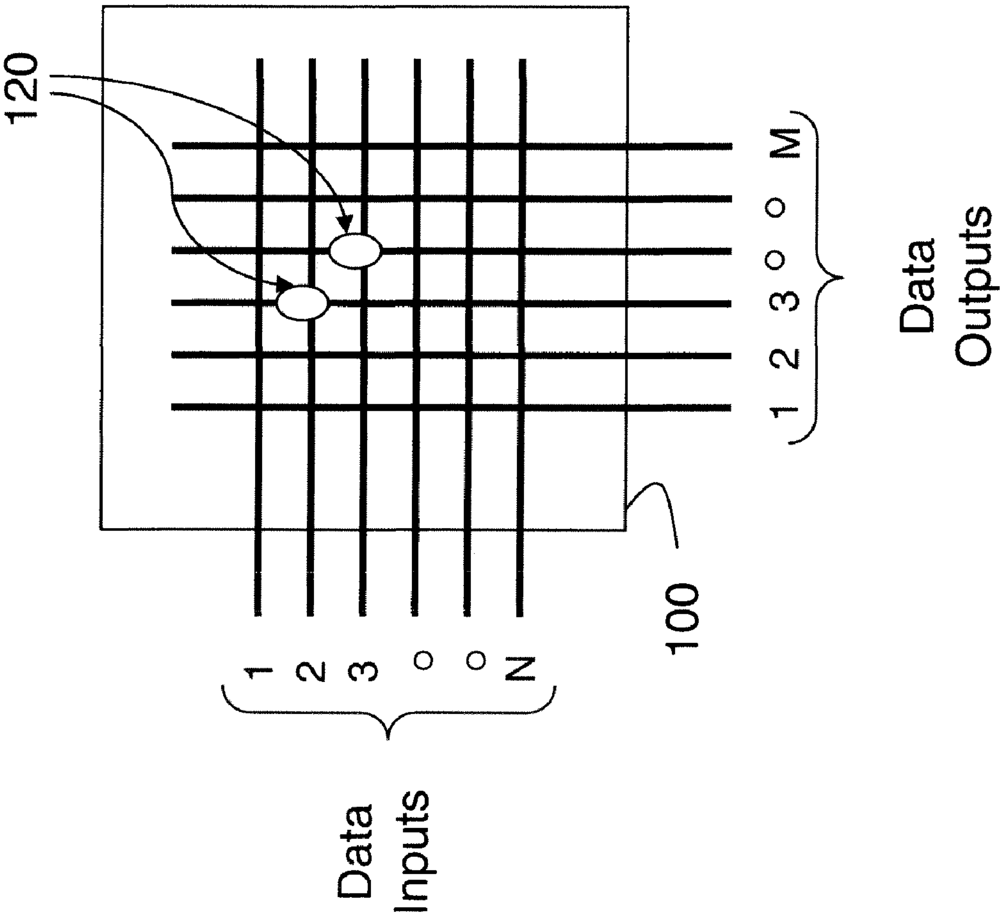
FIG. 1 is a schematic representation of a prior art switch-type crossbar.

Compared to photons and electrons traveling in a physical medium, electron streams in free space have many advantages in data switching. For example, since electrons are charged, they can easily be deflected and steered by electrical and magnetic fields. The present invention is directed to an electrical beam switch for interconnection between a plurality of inputs and outputs, which includes an array of electrically charged particle emitter source devices with an input connected to a slow wave structure coupled to the emitter source. An array of detectors is positioned relative to the array of emitter devices for receiving charged particles from various of the emitter devices with a slow wave structure associated with each detector device. X and y deflection means are positioned adjacent to each of the emitters for directing the charged particles from each of the emitters to at least one of the detectors.

The seminal work to define a basic electron beam switching occurred at Microelectronics and Computer Technology Corporation in the 1980s. These efforts are summarized in U.S. Pat. No. 5,068,580, entitled "Electrical Beam Switch." The data rate that can be conveyed by the system disclosed in the '580 patent, however, is not sufficient for the requirements of the present day.

Within the world of vacuum tubes there are electron beam modulation techniques that yield low frequency capabilities. The original and most commonly available vacuum tubes employ a metal grid through which the electrons pass. These grids are located proximal to the vacuum tube cathode and by changing the voltage on these grids, the number of electrons launched from the cathode can be increased or decreased. This is the technique suggested in U.S. Pat. No. 5,068,580 for modulating an electron beam in the device described therein.

A possible constraint with all conventional vacuum tube switches, such as the one disclosed in the U.S. Pat. No. 5,068,580 is that, by varying a control voltage on a grid located proximal to the cathode, one not only modulates the velocity of the electron beam; one also modulates how many electrons are liberated from the cathode. As the beam then drifts toward the output plate, the well-formed bunches separate because the dense part of the beam is traveling faster than the sparse part. If the beam is slow enough and the drift time long enough the beam effectively becomes homogeneous again. If the drift time is even longer then cycles overlap and information is lost. This effect limits the high frequency performance of vacuum tubes.

To address this problem, the two variables need to be controlled independently, with one held constant. The Varian brothers and others in the 1930s and 1940s took the approach of keeping the number of liberated electrons constant and modulating the velocity of the electrons. This was accomplished by applying an RF potential between 2 grids held at a constant potential with reference to the cathode. The 2 grids were placed one half a wavelength apart and evolved into perforated walls of a microwave cavity. The cavity then evolved into a helix and other slow wave structures present in Traveling Wave Tubes (TWTs).

TWTs commonly employ a helix, functioning as a slow wave structure, to slow the propagation of the signal to be amplified to approximately the same speed as the electron beam. The electron beam flows through the center of the helix. When the speeds of the electron beam and the slow wave structure nearly match, the electrical and magnetic fields produced from the slow wave structure cause the electrons in the beam to bunch according to the applied signal. This phenomenon is generally known as velocity modulation and is the basis of operation of TWT amplifiers.

The present state of the art of using the above mentioned technologies have limitations in their high frequency performance and their high power consumption. The high frequency performance of the technology of the conventional electron gating techniques, employing a control grid, in U.S. Pat. No. 5,068,580 limits operation to the single GHz range. Operation at frequencies up to approximately 100 Ghz is possible with TWTs employing helical slow wave structures. The frequency range of TWTs can be extended into the THz range by using slow wave structures constructed using MEMS technology.

Power is also an advantage both directly and indirectly of the present invention compared to the prior art. A TWT uses a slow wave structure, which in many cases is a helix and applies the required high voltage to this helix in order to accelerate the electrons. A magnetic field around the helix is used to focus the electron beam through the helix and also prevents the vast majority of the electrons from contacting the helix. After exiting the helix the electrons flow to a collector that is operated at a small fraction of the voltage applied to the helix, thus most of the electrons and therefore the current flow is between relatively low voltages. Because power is the product of current and voltage, this saves a great deal of power compared to a system where the electrons are returned to the high voltage accelerating node.

In U.S. Pat. No. 5,068,580 the electrons are returned to the high voltage accelerating electrode so the power is relatively high. U.S. Pat. No. 5,068,580, discloses using 100 electrons per 1 gHz cycle. This was done to keep their beam current in the nA region. 100 electrons is a small number of particles to convey information and subject to the quantum statistics of the cathode. The cathode quantum statistical noise limits the communications capacity of the system. The present invention uses 100000 electrons per RF cycle and so it has a much higher communications capacity. Since the invention uses 1000 times the current of the system described in U.S. Pat. No. 5,068,580 the ability to cool the device would be impractical without the power savings that accrues to returning the electrons to a low voltage relative to the cathode as is the case in TWTs.

Within a traditional TWT, the slow wave structure exists as a single unit with the input signal sent into the side of the slow wave structure proximal to the electron emitter. At the center of the slow wave structure is an attenuator or a sever to effectively isolate the input side of the slow wave structure from the output side. The output side of the slow wave structure is distal from the electron emitter and the output signal is typically collected from the point of the slow wave structure most distal from the electron emitter.

TWTs are employed primarily in Satellite communication Radar and Electronic Warfare Systems. The use of a TWT in hardwired communication system is rarely seen, if at all.

Referring now to FIG. 1, a conventional crossbar system generally indicated by the reference numeral 100 is shown for the interconnection of communication nodes. The network 100 has n inputs and m outputs which are arranged so that any of the inputs can be selectively connected to any of the outputs. This requires a switch 120 at the intersection of each of the inputs and each of the outputs. The number of switches is n×m. Therefore, a hard-wired system using electronic switches 120 becomes impractical when the number of inputs is large. A switch with 1000 ports requires 1000000 switches.

Referring now to FIG. 2, one embodiment of an electron beam crossbar switch of the present invention is generally indicated by the reference numeral 200 and generally includes a two-dimensional array of electrical charged particle emitter source devices such as electron emitters 210 associated with slow wave structures 220, an array of x and y deflection means such as plates 230 for selectively directing the electrons from each of the emitters in the array 210, and a two-dimensional array of detectors 240 made from silicon receptors positioned for receiving electrons from various of the emitters after begin redirected by the deflection means 230.

Alternatively, because this application does not require high power output, the electron beam can be directed to strike a metallic contact coupled to a semiconductor amplifier input. From the metallic contact onwards into the semiconductor amplifier, operation is similar to any hardwired semiconductor amplifier.

A data input 250 is connected to each of the slow wave structures associated with the electron emitters in the array 210. The principle in the design of the slow wave structure is to slow the forward propagation of the electromagnetic wave to approximately match the speed of the electron beam. The electron beam is typically traveling at approximately 1/10th the speed of light, so each of the slow wave structures 220 may be implemented as a helix functioning as a delay line to reduce the forward propagation of the electromagnetic wave by a factor of 10. The x and y deflection plates in the deflection plate array 230 direct the electrons from each of the emitters 210 to a selected one of the detectors in the detector array 240.

Figure 2A:
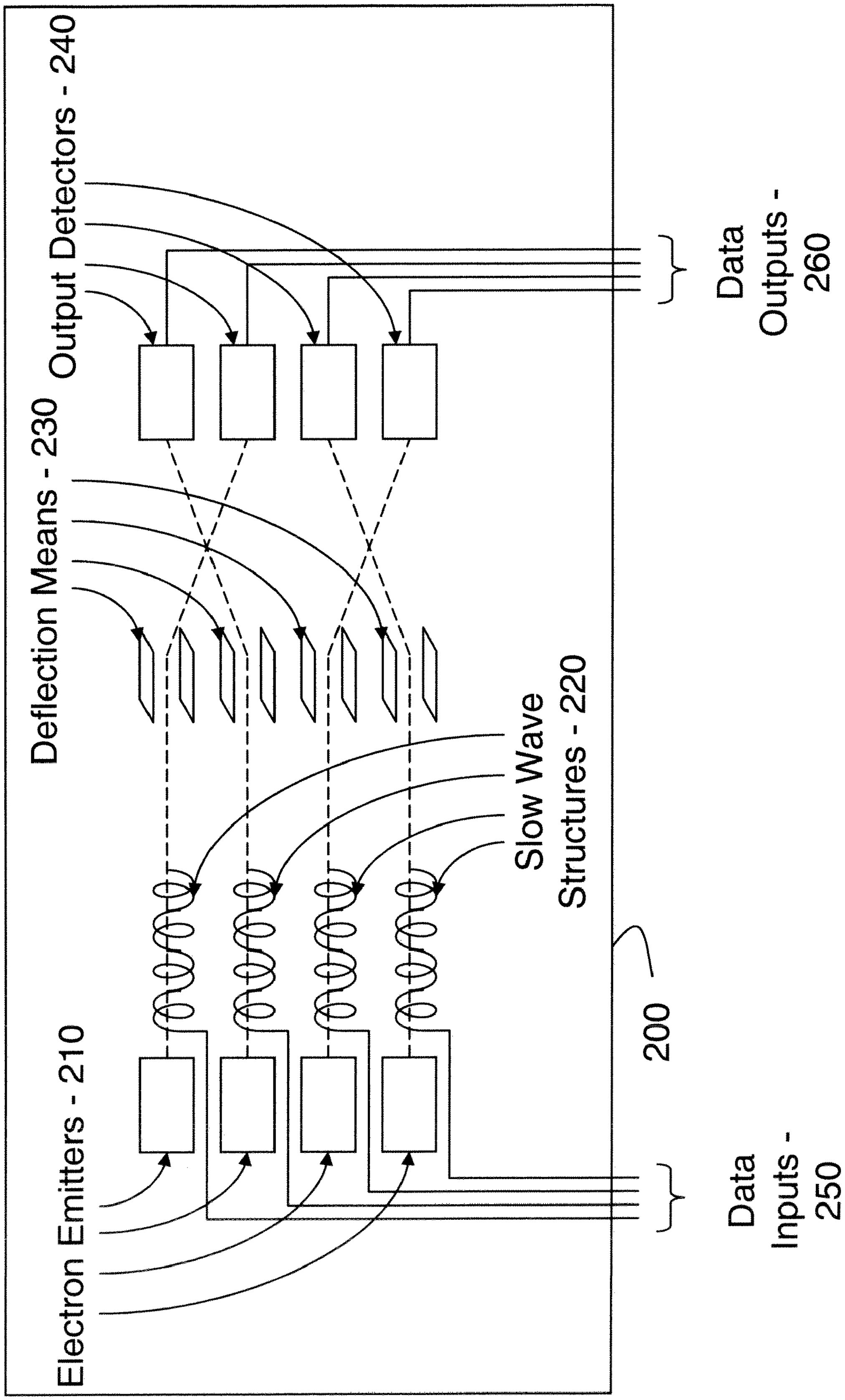
FIGS. 2A-2B are schematic views, in cross section, of electron beam crossbar switches in embodiments of the present invention.
Figure 2B:
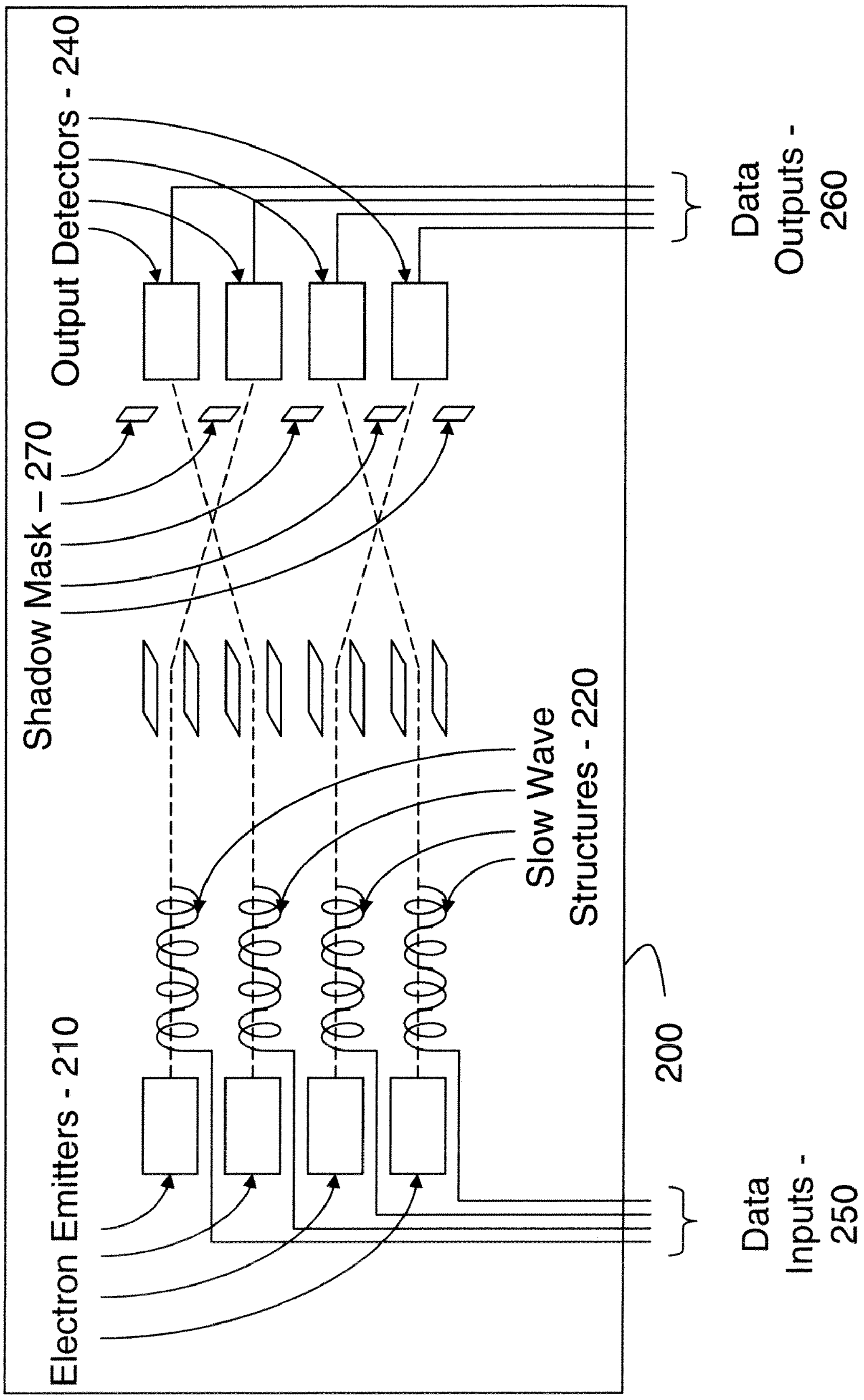

If desired, a shadow mask 270 as shown in FIG. 2B may be provided directly in front of the detectors 240 for capturing stray electrons and may be useful in reducing background noise. Furthermore, it may be useful to direct the beam to be intercepted by the shadow mask 270 when a channel is inactive or when the beam is being relocated to a different detector. Having a neutral location to place the beam during repositioning removes the requirement to switch the beam off during repositioning.

The electron beam crossbar switch 200 is shown schematically in FIG. 2A for receiving a plurality of data inputs 250, such as 1024, which can be provided by a 32×32 array. Each of the 1024 inputs is connected to one of the slow wave structures 230. The emitter array 210 may be any conventional field emission electron array, such as that disclosed in U.S. Pat. No. 4,663,559, or any other type of charged particle emitter. The deflection plate means 230 may include a set of electrostatic deflection plates in both the x direction and y direction for each of the emitters, such as deflection plates 230. The sets of x and y deflection plates may be in the same plane in a single array or may be in two side-by-side arrays. Deflection voltage is applied to the deflection plates, thus each of the emitters 210 and slow wave structures 230 has the ability to direct data to any of the detectors in the detector array 240 by adjusting the voltages on the x and y deflection plates. Owing to the small mass of electrons, redirecting data can be done very rapidly, for example; oscilloscope Cathode Ray Tubes employing electrostatic deflection are able to scan the entire tube face within 1 nanosecond or less.

The detector array 240 preferably uses wide bandwidth devices. For example, a TWT configured for amplification typically can achieve an octave of bandwidth. A TWT designed for a center frequency of 30 GHz can achieve a bandwidth of 20 GHz or more.

The time of flight of the electrons is important, because it needs to be nearly matched to the wave propagation time through the slow wave structures 220. These slow wave structures may, for example, be helices where the electron beam is cylindrical or ridged waveguides where the beam is rectangular or sheet shaped. The slow wave structures 220 may also employ a dielectric to slow the wave further so long as there is sufficient mechanical clearance to allow the electron beam to pass through the slow wave structures 220 without coming into contact with the dielectric.

As previously mentioned, x and y deflection means 230 may be magnetic deflection means, electrostatic deflection means, or a combination thereof.

Figure 3:
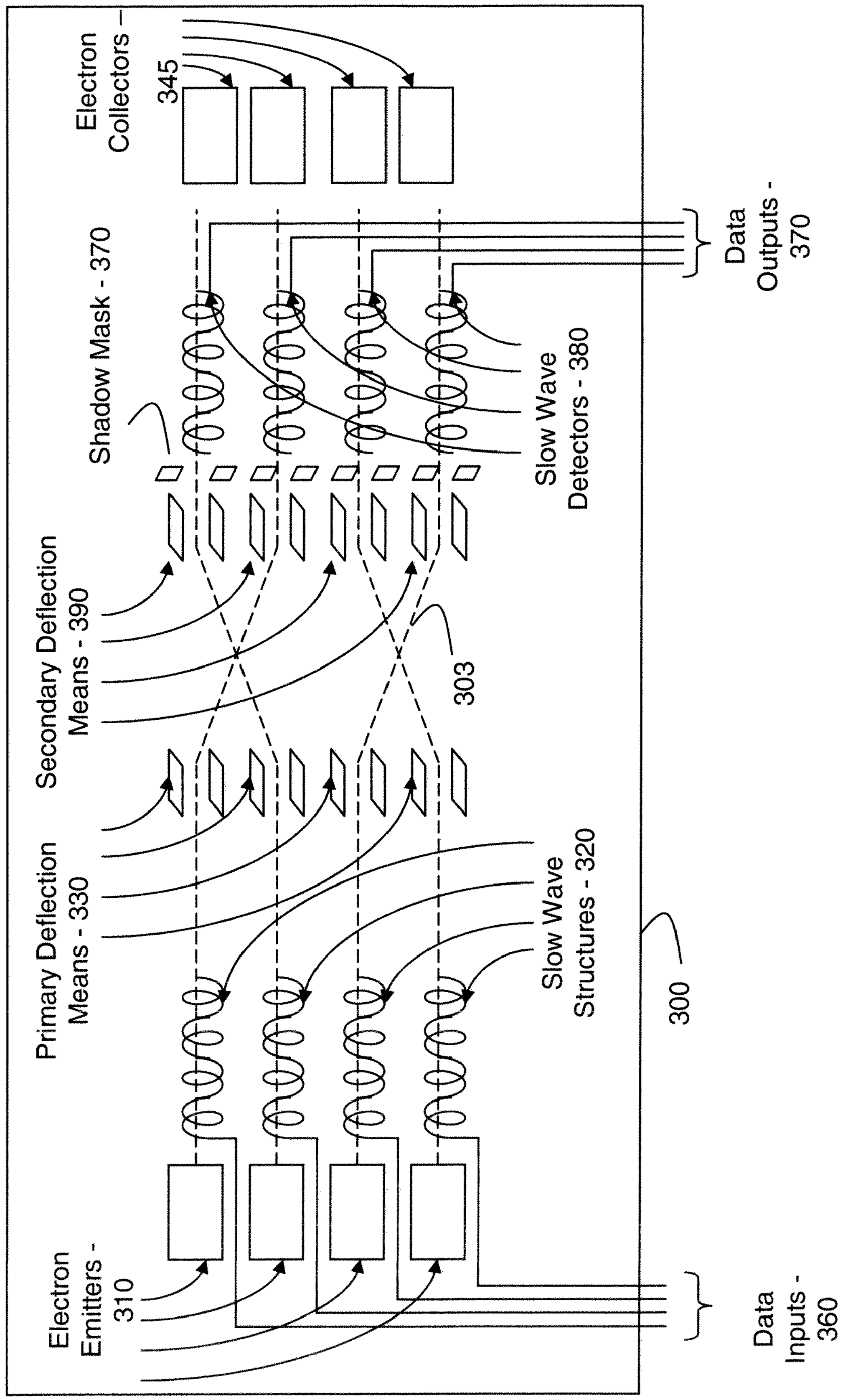
FIG. 3 is a schematic view, in cross section, of an electron beam crossbar switch in one embodiment of the present invention.

Referring now to FIG. 3, one embodiment of an electron beam crossbar switch of the present invention is generally indicated by the reference numeral 300, and like the implementation in FIGS. 2A and 2B it includes a two-dimensional array of electrical charged particle emitter source devices such as electron emitters 310 associated with slow wave structures 320, an array of x and y primary deflection means such as plates 330 for selectively directing the electrons from each of the emitters in the array 310, a secondary deflection array 390 for focusing and redirecting the electrons, and a two-dimensional array of detectors made from slow wave structures 380 positioned for receiving electrons from various of the emitters. A data input 360 is connected to each of the slow wave structures associated with the electron emitters in the array 310. The x and y deflection plates in the primary deflection plate array 330 direct the electrons from each of the emitters 310 to a selected one of the detectors in the detector array 380. The secondary deflection array 390 focuses and redirects electrons onto the slow wave structure detector 380 feeds a data output 370. Spent electrons are captured in electron collector 345.

If desired, a shadow mask 370 may be provided between the secondary deflection array 390 and the slow wave detectors 380 for capturing stray electrons and reducing background noise. Furthermore, it may be useful to direct the beam to be intercepted by the shadow mask 370 when a channel is inactive or when the beam is being relocated to a different detector. Having a neutral location to place the beam during repositioning removes the requirement to switch the beam off during repositioning.

The slow wave detector array 380 preferably uses wide bandwidth devices, similar to those used in TWTs. For example, a TWT configured for amplification typically can achieve an octave of bandwidth. A TWT designed for a center frequency of 30 GHz can typically achieve a bandwidth of 20 GHz or more.

For physically long slow wave structures used in the detector, the required deflection accuracy of the electron beams could become a problem. The electron beam ideally should pass through the center of the slow wave structure rather than pass through it at an angle. Thus, the secondary deflection array 390 may be added to guide the electron beam through the center of the detecting slow wave structure 380.

The time of flight of the electron beams 303 is important, it needs to be nearly matched to the wave propagation time through the slow wave structures 320. These slow wave structures 320 may, for example, be helices where the beam is cylindrical or ridged waveguides where the beam is rectangular or sheet. The slow wave structures may also employ a dielectric to slow the wave further so long as there is sufficient mechanical clearance to allow the electron beam to pass through the slow wave structure without coming into contact with the dielectric.

The crossbar 300 shown in FIG. 3 is unidirectional. A second crossbar (not shown) may be used to provide two-way communication between the senders and receivers.

As market requirements evolve and more bandwidth is needed this device can evolve beyond the upper frequency bound of approximately 100 Ghz typically associated with helices supported by ceramic posts commonly used as slow wave structures. Extension into the THz range is presently being done in state of the art TWT by building slow wave structures using MEMS techniques. A slow wave MEMS structure can be constructed from a metal over insulator over silicon (MIS) structure. In an MIS structure with a very thin insulating layer the magnetic field travels virtually unimpeded, but owing to the fact that approximately ½ of the electrical field is effectively short-circuited by the silicon, the electromagnetic wave travels more slowly than in free space.

Embodiments of the present invention, therefore, are well-adapted to carry out the objects and attain the ends and advantages mentioned herein as well as others inherent therein. It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

The foregoing has outlined, in general, the physical aspects of embodiments of the invention and is to serve as an aid to better understanding such embodiments. In reference to such, there is to be a clear understanding that the present invention is not limited to the method or detail of construction, fabrication, material, or application of use described and illustrated herein. Any other variation of fabrication, use, or application should be considered apparent as an alternative embodiment of the present invention. It should be further understood that various types of electrically charged particles may be substituted for the electrons.

The invention claimed is:

1. An electron beam crossbar switch for interconnection between communication units comprising:

an array of electron emitters associated with a first plurality of slow wave structures;

a plurality of data inputs connected to the first plurality of slow wave structures, wherein each of the data inputs is connected to a corresponding one of the first plurality of slow wave structures;

an array of data output detectors positioned relative to the array of electron emitter slow wave devices for receiving electrons from any of the first plurality of slow wave structures;

first deflection means positioned between one of the first plurality of slow wave structures and the detectors for directing the electrons from one of the emitters to a selected one of any of the data output detectors; and a plurality of data outputs connected to the array of data output detectors, wherein each of the data outputs is connected to a corresponding one of the array of data output detectors.

2. The electron beam crossbar switch of claim 1, wherein the array of data output detectors comprises a second plurality of slow wave structures, positioned between the array of electron emitters and the plurality of data outputs, the second plurality of slow wave structures comprising means for receiving electrons from any of the electron emitters.

3. The electron beam crossbar switch of claim 2, further comprising:

second deflection means positioned adjacent the array of data output detectors for directing the electrons through the selected one of the data output detectors.

4. The electron beam crossbar switch of claim 1, further comprising:

second deflection means positioned adjacent the array of data output detectors for directing the electrons through the selected one of the data output detectors.

5. The electron crossbar switch of claim 3, further comprising:

a shadow mask positioned between the second deflection means and the data output detectors means.

6. The electron beam crossbar switch of claim 1, further comprising:

a shadow mask adjacent to a side of the array of data output detectors proximate to the first deflection means.

7. The electron beam crossbar switch of claim 1, wherein each of the first plurality of slow wave structures is helical and the electrons form a cylindrical electron beam.

8. The electron beam crossbar switch of claim 1, wherein each of the first plurality of slow wave structures is rectangular and the electrons form a sheet beam.

9. The electron beam crossbar switch of claim 1, wherein the first plurality of slow wave structures comprises means for controlling the forward propagation of an electromagnetic wave to match the speed of an electron beam.

10. The electron beam crossbar switch of claim 1, wherein the first plurality of slow wave structures comprises a waveguide.

11. The electron beam crossbar switch of claim 1, further comprising a gas, the gas comprising means for forming a plasma in reaction to transmission of the electrons through the gas.

12. The electron beam crossbar switch of claim 1, wherein the first deflection means comprises electric field deflection means.

13. The electron beam crossbar switch of claim 1, wherein the first deflection means comprises magnetic field deflection means.

* * * * *